United States Patent
Byun

(10) Patent No.: US 6,735,491 B2
(45) Date of Patent: May 11, 2004

(54) SYSTEM AND METHOD FOR OPTIMALLY DESIGNING AUTOMOBILE DOOR SEALS

(75) Inventor: Yong-Tae Byun, Suwon (KR)

(73) Assignee: Hyundai Motor Company, Seoul (KR)

( * ) Notice: Subject to any disclaimer, the term of this patent is extended or adjusted under 35 U.S.C. 154(b) by 547 days.

(21) Appl. No.: 09/747,948

(22) Filed: Dec. 27, 2000

(65) Prior Publication Data

US 2002/0065975 A1 May 30, 2002

(30) Foreign Application Priority Data

Nov. 24, 2000 (KR) ........................................ 2000-70370

(51) Int. Cl.[7] .............................................. G06F 19/00
(52) U.S. Cl. ........................... 700/98; 700/97; 700/173; 700/213; 700/118; 700/163; 53/122; 53/75; 53/105; 53/106; 53/113
(58) Field of Search ............................ 700/97, 98, 173, 700/213, 118, 163; 53/122, 75, 105, 106, 113

(56) References Cited

U.S. PATENT DOCUMENTS

| | | | | |
|---|---|---|---|---|
| 5,383,710 A | * | 1/1995 | Premji | 297/378.12 |
| 5,568,404 A | * | 10/1996 | Strumolo | 702/140 |
| 5,940,788 A | * | 8/1999 | Morman et al. | 702/138 |
| 6,081,654 A | * | 6/2000 | Morman et al. | 703/1 |
| 6,138,415 A | * | 10/2000 | Ohtsu et al. | 49/490.1 |
| 6,438,445 B1 | * | 8/2002 | Yoshida et al. | 700/173 |

* cited by examiner

*Primary Examiner*—Ramesh Patel
*Assistant Examiner*—Thomas Pham
(74) *Attorney, Agent, or Firm*—Birch, Stewart, Kolasch & Birch, LLP

(57) ABSTRACT

Disclosed herein is a system and method for optimally designing automobile door seals. The system comprises data storage, data management and model design. The data storage consists of a plurality of storage units, each of which has data necessary for each condition. The data management consists of a plurality of mode selection units for selecting a mode from the data storage according to the characteristics of a door seal to be developed. The model design designs a complete door seal by imposing a variety of conditions on a model selected from the data management and performing various tests. The method comprises a design condition setting step in which all conditions concerning a design project are set, a test model setting step in which there are set test conditions, a design condition test step in which design conditions are imposed on the test model, a test model settlement step in which the test model is interpreted on the basis of various conditions so as to find correlation with an automobile door, and a modification step in which the test model is modified if necessary, or the data of the completed door seal are stored.

11 Claims, 19 Drawing Sheets

SYSTEM AND METHOD FOR OPTIMALLY DESIGNING AUTOMOBILE DOOR SEALS

BACKGROUND OF THE INVENTION

1. Field of the Invention

The present invention relates generally to a system and method for optimally designing automobile door seals, and more particularly to a system and method for optimally designing automobile door seals, which is capable of estimating the closing speed of the automobile door while performing various interpretations in consideration of all variables according to design steps.

2. Description of the Prior Art

In general, a door seal having flexibility is attached to the circumference of an automobile door so as to absorb the shock of door's closing and to prevent rainwater from infiltrating into the automobile.

Generally, such a door seal has been developed in such a way that a designer designs the cross-section of the door seal suitable for an automobile under development, an interpretation expert interprets the cross-section of the door seal using an interpretation program, the designer revises the cross-section after consultation with the interpretation expert on the basis of the interpretation and settles a model of the door seal, and the designer asks a manufacturer to fabricate a sample.

However, the designer and the interpretation expert are involved in the development of the door seal, so that the designer cannot interpret the cross-section of the door seal in advance, thereby causing the design to be imperfect. In addition, the designed cross-section has to be interpreted after the design and revised after the interpretation, so that the development of the door seal is an inconvenient and time-consuming operation.

Further, conventional software for interpreting the door seal has a shortcoming in that it cannot estimate the closing speed of a door on the basis of the interpretation results on the cross-section of the door seal.

SUMMARY OF THE INVENTION

Accordingly, the present invention has been made keeping in mind the above problems occurring in the prior art, and an object of the present invention is to provide a system and method for optimally designing automobile door seals, which is capable of allowing a designer without a professional knowledge of computer software to design a door seal having an optimal cross-section by varying design variables and elements necessary for various design steps, and of estimating the closing speed of an automobile door depending upon the variation of the cross-section of the door seal so as to prevent errors in the fabrication of a sample.

In order to accomplish the above object, the present invention provides a system for optimally designing automobile door seals, comprising: data storage means consisting of a plurality of storage units, each of the storage units having data necessary for each condition; data management means consisting of a plurality of mode selection units for selecting a mode from the data storage means according to the characteristics of a door seal to be developed; and model design means for designing a complete door seal by imposing a variety of conditions on a model selected from the data management means and performing various tests.

In addition, the present invention provides a method for optimally designing automobile door seals, comprising: a design condition setting step in which all conditions concerning a design project are set in such a way that the design project corresponding to an automobile being developed is selected in a data management means and the conditions set in mode selection units are retrieved from the storage units of a data storage means; a test model setting step in which there are set test conditions concerning initial conditions according to the model designed by the post-processing means of a model design means; a design condition test step, in which design conditions are imposed on the test model selected in a pre-processing means by a design condition setting unit and a variable mode setting unit in the post-processing means of a model design means, and the test model is interpreted; a test model settlement step in which the test model, which is interpreted with regard to theoretical setting conditions by the door application preliminary condition setting unit of the post-processing means, is interpreted on the basis of various conditions so as to find correlation with an automobile door; and a modification step in which the test model is modified if necessary on the basis of the interpretation results of the test model settled by the modification setting unit of the post-processing means, or the data of the completed door seal are stored in the storage units of the data storage means.

BRIEF DESCRIPTION OF THE DRAWINGS

The above and other objects, features and other advantages of the present invention will be more clearly understood from the following detailed description taken in conjunction with the accompanying drawings, in which:

FIGS. 9A and 9b 4 are views showing the contact conditions of a door seal;

DESCRIPTION OF THE PREFERRED EMBODIMENTS

With reference to the accompanying drawings, an embodiment of the present invention is described in detail.

Figure 1:
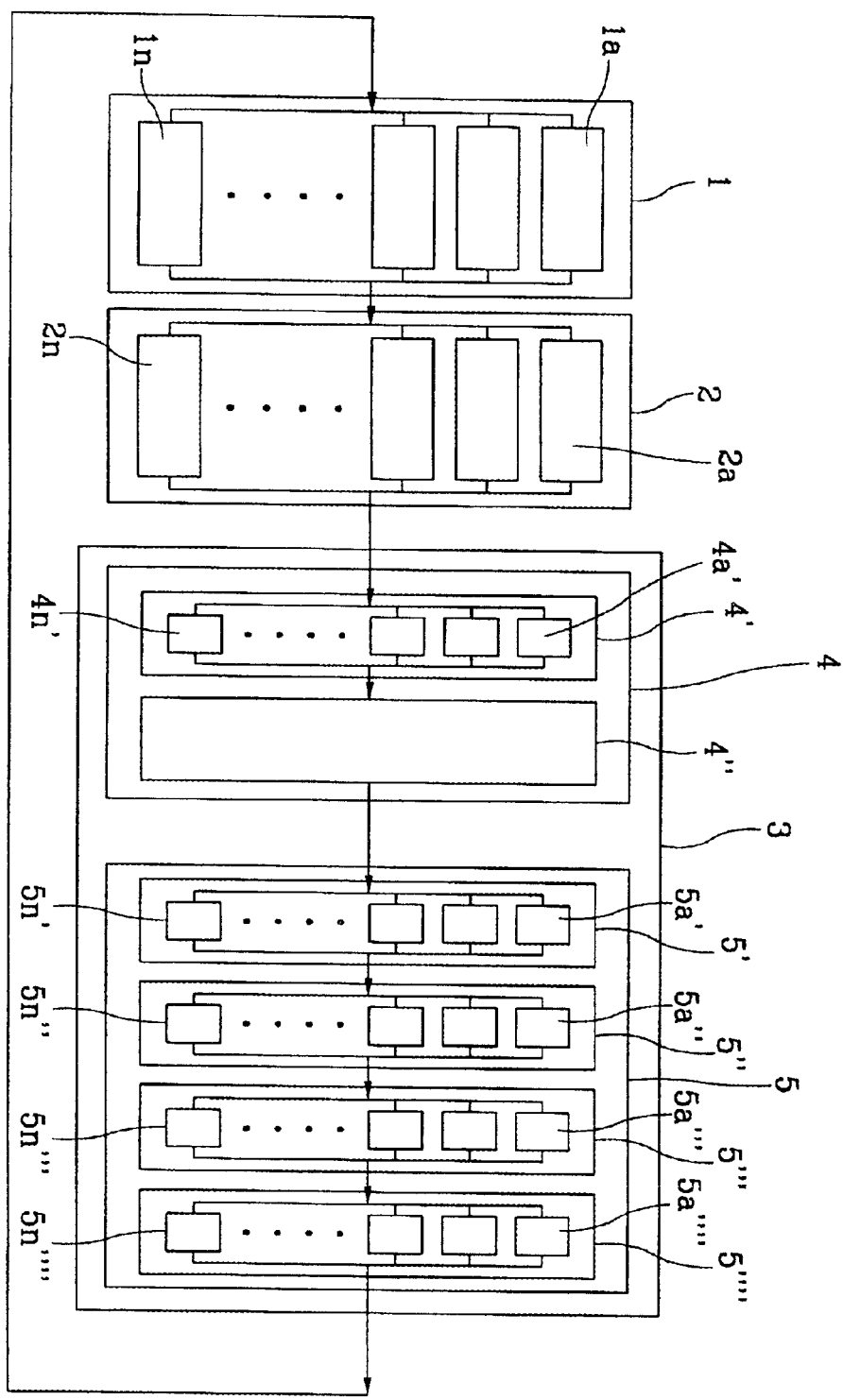
FIG. 1 is a block diagram showing a system for optimally designing automobile door seals.
Figure 2:
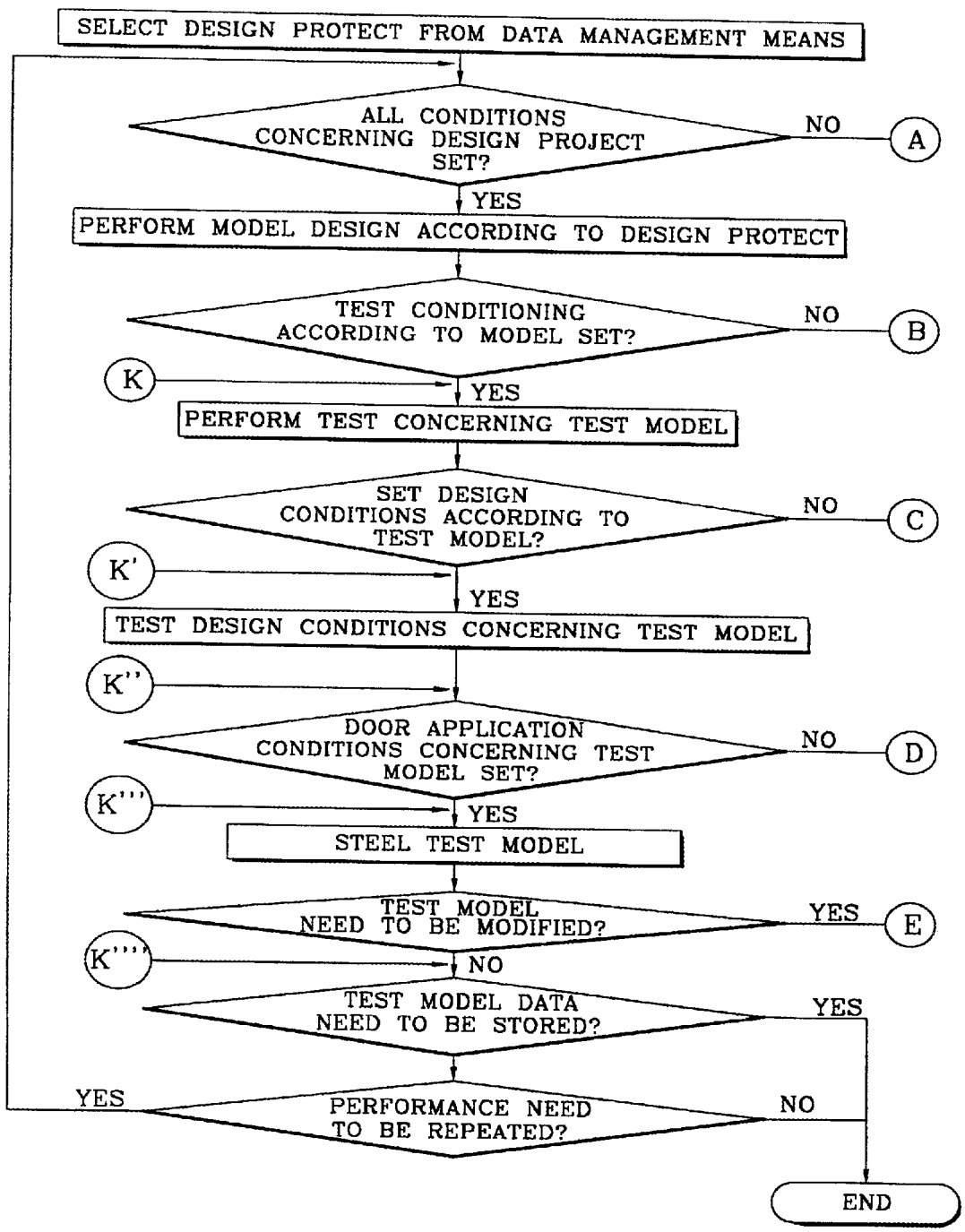
FIGS. 2 to 7 are flowcharts showing a method for optimally designing automobile door seals.

FIG. 1 is a block diagram showing a system for optimally designing automobile door seals in accordance with the present invention.

The optimal design system comprises data storage means 1, data management means 2 and a model design means 3. The data storage means 1 consists of a plurality of storage units 1a to 1n each having data necessary for each condition. The data management means 2 consists of a plurality of mode selection units 2a to 2n for selecting a mode from the data storage means 1 according to the characteristics of a door seal to be developed. The model design means 3 designs a complete door seal by imposing a variety of conditions on a model selected from the data management means 2 and performing various tests.

In such a case, the model design means 3 comprises pre-processing means 4 and post-processing means 5. The pre-processing means 4 tests the test model selected from the data management means 2 using basic and fundamental application conditions. The post-processing means 5 settles a completed door seal by changing and revising the structure and shape of the test model, and stores the data of the completed door seal in the data storage means 1.

In such a case, the pre-processing means 4 comprises an initial condition setting unit 4' and a test model setting unit 4". The initial condition setting unit 4' consists of a plurality of condition units 4a' to 4n' that impose conditions concerning the mode and application of a model on the model to be designed. The test model setting unit 4" selects a test model on which initial conditions are imposed by the initial condition setting unit 4'.

In addition, the post-processing unit 5 comprises a design condition setting unit 5', a variable mode setting unit 5", a door application preliminary condition setting unit 5''', and a modification setting unit 5''''. The design condition setting unit 5' consists of a plurality of design condition units 5a' to 5n' that impose a variety of design conditions on the test model selected from the test model setting unit 4". The variable mode setting unit 5" consists of a plurality of design variable mode units 5a" to 5n" that impose a variety of variables on the design condition setting unit 5'. The door application preliminary condition setting unit 5''' consists of a plurality of door application preliminary condition units 5a''' to 5n''' that impose correlation with an actual door on the variable mode setting unit 5". The modification setting unit 5'''' consists of a plurality of modification units 5a'''' to 5n'''' that change and modify the test model on the basis of the results of interpretation performed in the door application preliminary condition setting unit 5'''.

Hereinafter, the design steps of the door seal in accordance with the present invention are described in detail.

First of all, there is performed a design condition setting step in which all the conditions concerning a design project are set in such a way that the design project corresponding to an automobile being developed is selected in the data management means 2 and the conditions set in the mode selection units 2a to 2n are retrieved from the storage units 1a to 1n of the data storage means 1.

Thereafter, a test model is selected through a test model setting step in which there are set test conditions concerning initial conditions according to the model designed by the post-processing means 4 of the model design means 3.

Additionally, the interpretation of the theoretically set conditions is performed through a design condition test step, in which design conditions are imposed on the test model selected in the pre-processing means 4 by the design condition setting unit 5' and the variable mode setting unit 5" in the post-processing means 5 of the model design means 3, and the test model is interpreted.

Subsequently, the structure, shape and material of the door seal are settled through a test model settlement step in which the test model, which is interpreted with regard to theoretical setting conditions by the door application preliminary condition setting unit 5''' of the post-processing means 5, is interpreted on the basis of various conditions so as to find correlation with a door.

The door seal design project is completed through a modification step in which the test model is modified if necessary on the basis of the interpretation results of the test model settled by the modification setting unit 5'''' of the post-processing means 5, or the data of the completed door seal are stored in the storage units 1a to 1n of the data storage means 1.

Figure 3:
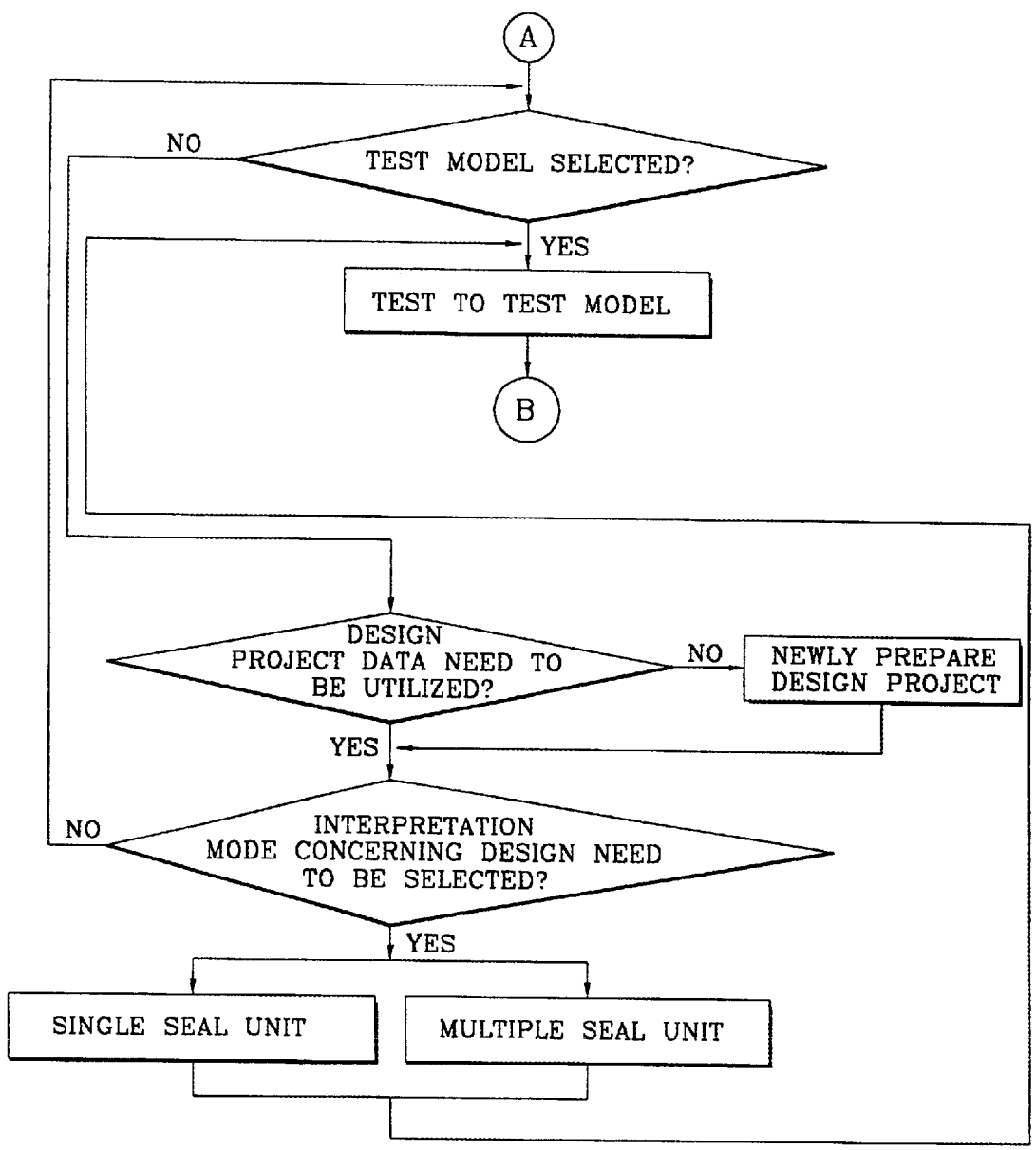

In the meantime, as illustrated in FIG. 3, if there are not set all the conditions required for the design project in the design condition setting step, there is performed an independent design step in which an independent test model is selected or a modification design step in which a modified test model is selected using previously designed data.

In the independent design step, after the schematic shape of the door seal S suitable for the structures and shapes of the side seal panel P and the door D in accordance with the automobile being developed is set and a material having corresponding characteristics is selected, tests are performed to interpret the characteristics of the material suitable for the structure and shape of the selected door seal S and the tests of the design conditions are performed.

Figure 4:
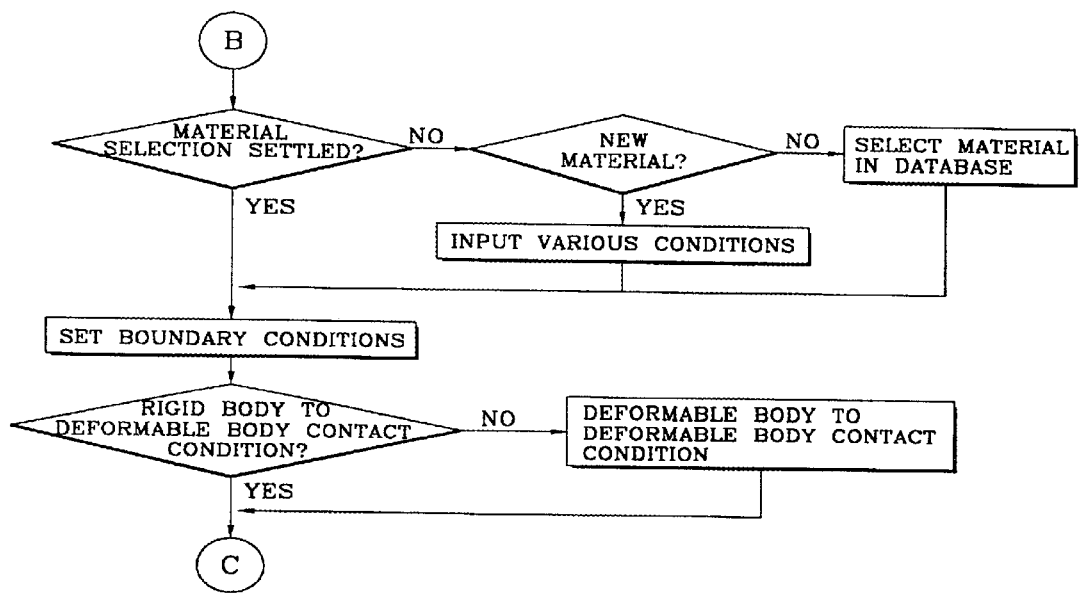

In such a case, the interpretation of the characteristics of the material suitable for the structure and shape of the selected door seal S is performed through a material selection step and a material contact condition setting step, as shown in FIG. 4. The material selection step is preformed by selecting a material and interpreting the material, and the material contact condition setting step is performed by imposing on the door seal S boundary conditions concerning the contact portions of the door seal S with the side seal panel P and the door D.

Figure 9A:
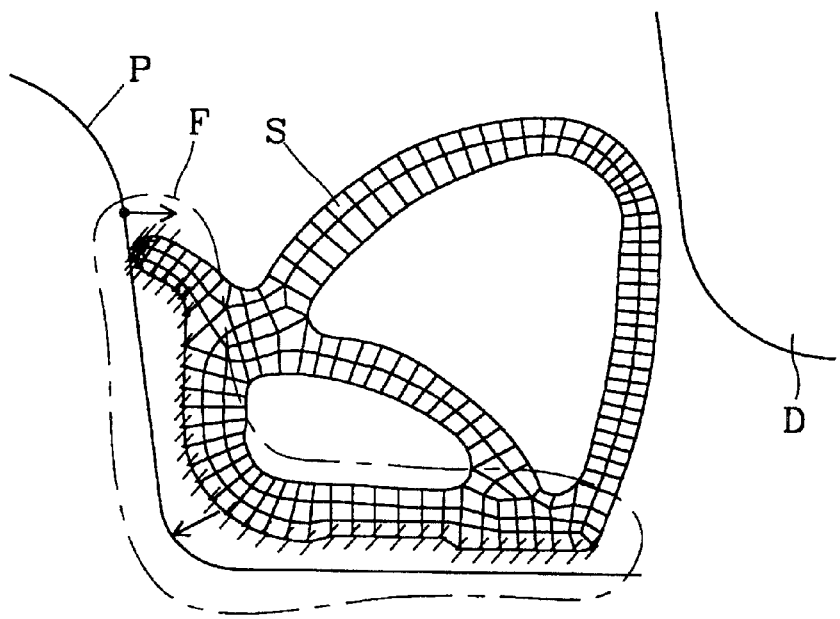
Figure 9B:
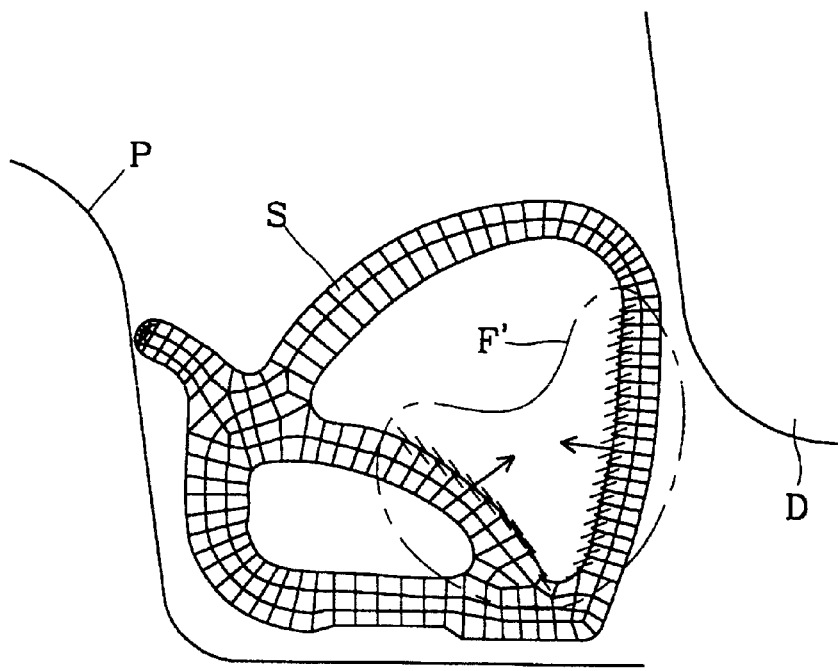

In the material contact condition setting step, rigid body to deformable body interpretation and deformable body to deformable body interpretation are performed. The rigid body to deformable body interpretation, as shown in FIG. 9A, is performed by interpreting the deformation of the friction-deformed portion F of the door seal S in contact with the side seal panel P, while the deformable body to deformable body interpretation, as shown in FIG. 9B is performed by interpreting the deformation of the self-weight-deformed portion F' of the door seal S due to the structure the door seal S.

In the modification design step, a single seal S or a plurality of seals S are selected using previous data retrieved from the storage units 1a to 1n of the data storage means 1 and the independent test model selected in the independent design step is tested so as to interpret the characteristics of a material suitable for the structures and shapes of the selected door seals S.

Figure 5:
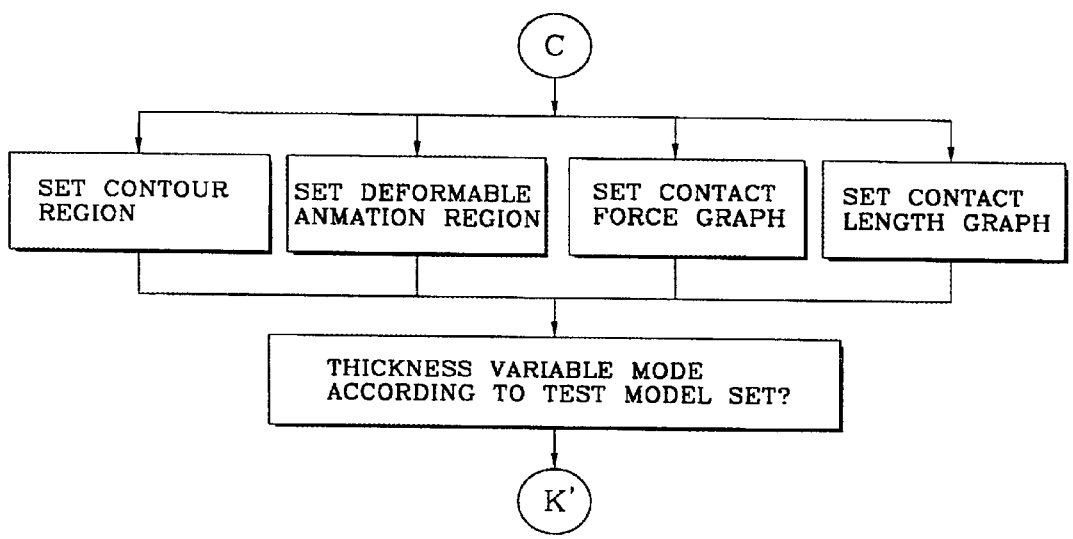

As indicated in FIG. 5, if there are not set all the test conditions required for the test model in the test model setting step, there are performed a deformation characteristic setting step, a thickness variable interpretation step and a design condition interpretation step, in order. The deformation characteristic setting step is preformed by setting conditions for performing the interpretation of various deformations of the test model. The thickness variable interpretation step is performed by interpreting changes according to the thickness variable of the door seal S on the basis of interpretation results obtained in the deformation characteristic setting step.

In such a case, in the deformation characteristic setting step, characteristics are imposed on a contour region setting, a deformed shape animation region setting and a contact force/contact length region setting so as to interpret effects accompanying the deformation of the door seal S situated between the side seal panel P and the door D caused by the closing action of the door D.

Figure 10:
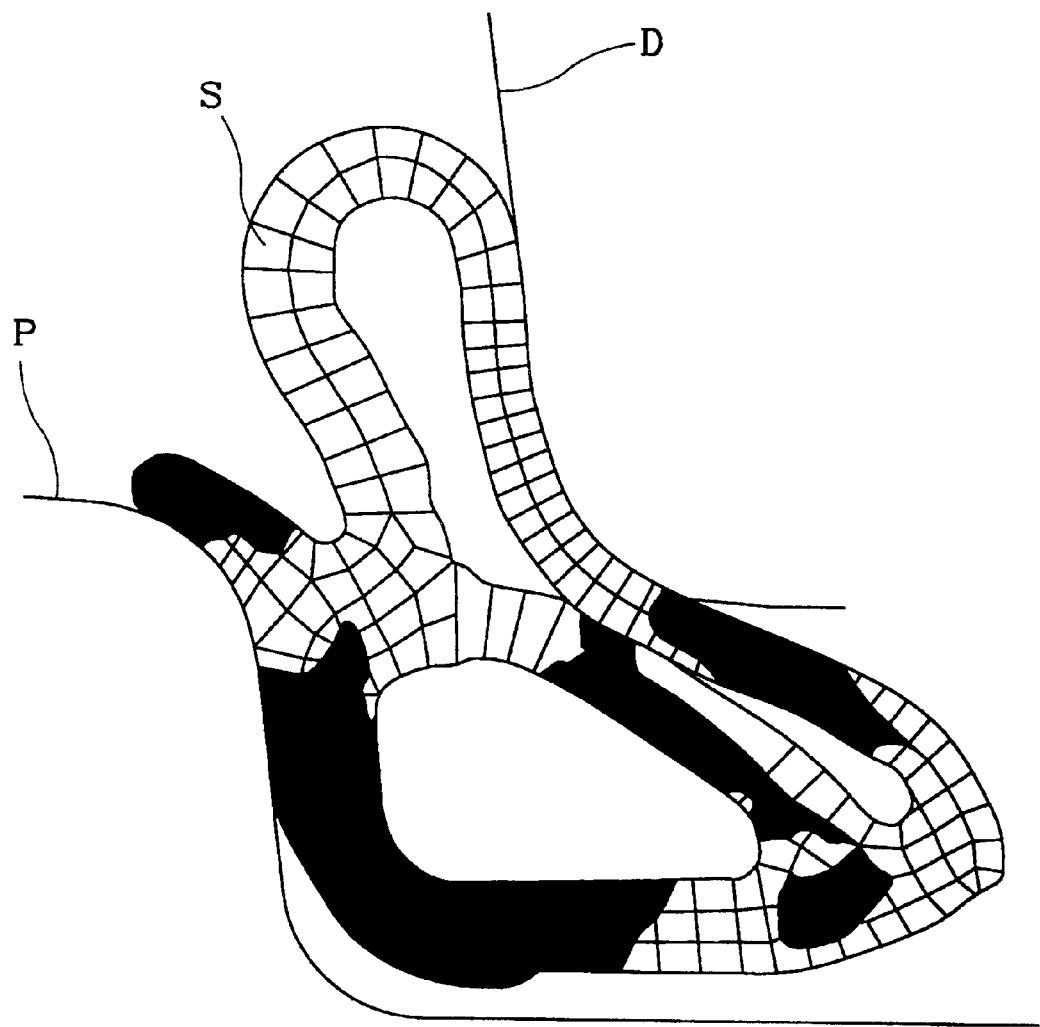
FIG. 10 is a view showing the interpretation result of the contour region setting of a deformation characteristic setting step.
Figure 11A:
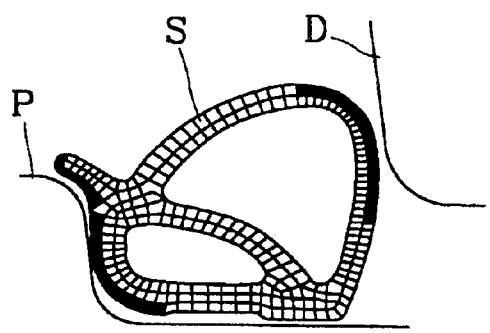
FIGS. 11A to 11I are views showing the interpretation result of the animation region setting of the deformation characteristic setting step.
Figure 11B:
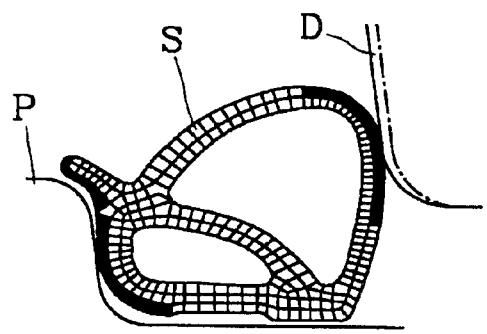
Figure 11C:
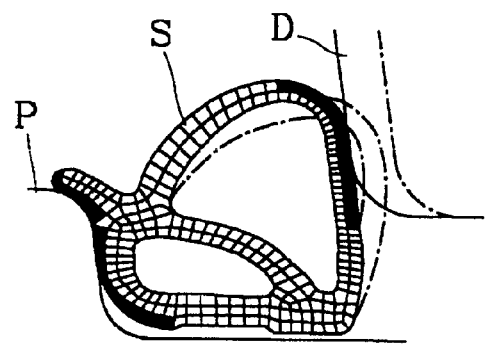
Figure 11D:
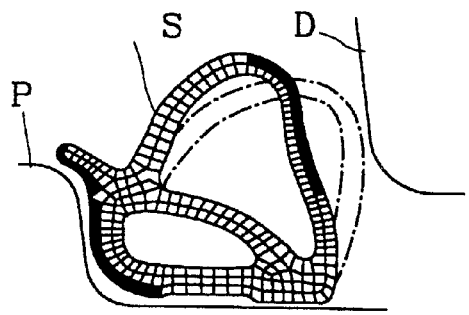
Figure 11E:
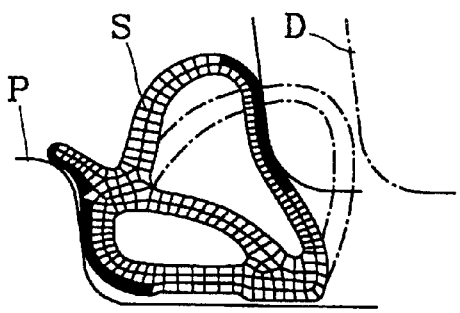
Figure 11F:
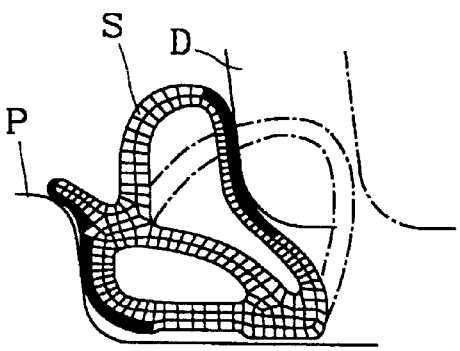
Figure 11G:
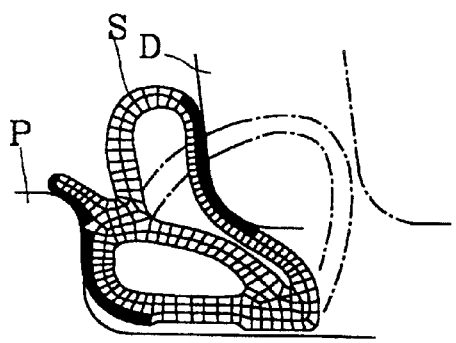
Figure 11H:
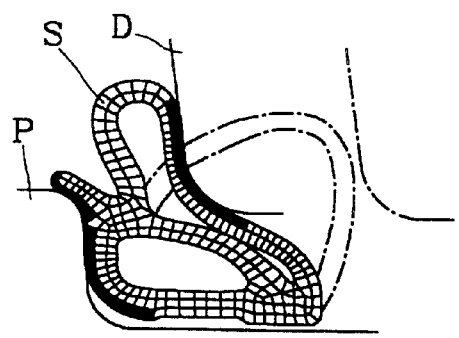
Figure 11I:
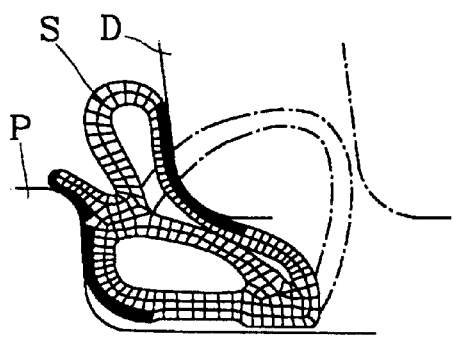
Figure 12A:
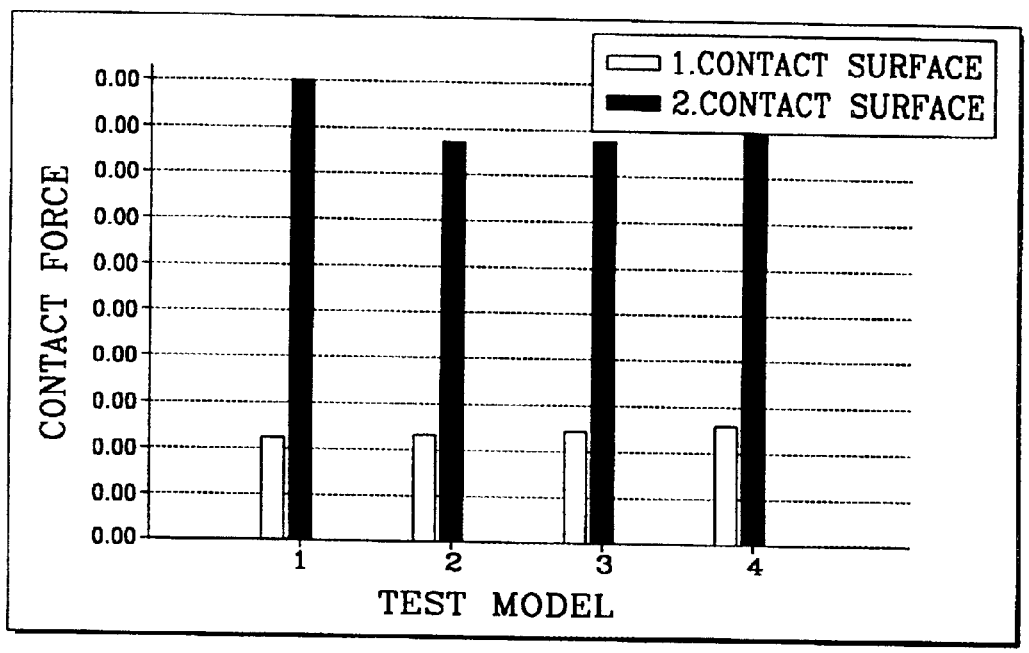
FIGS. 12A and 12B are views showing the interpretation result of the contact force/contact length region setting of the deformation characteristic setting step.
Figure 12B:
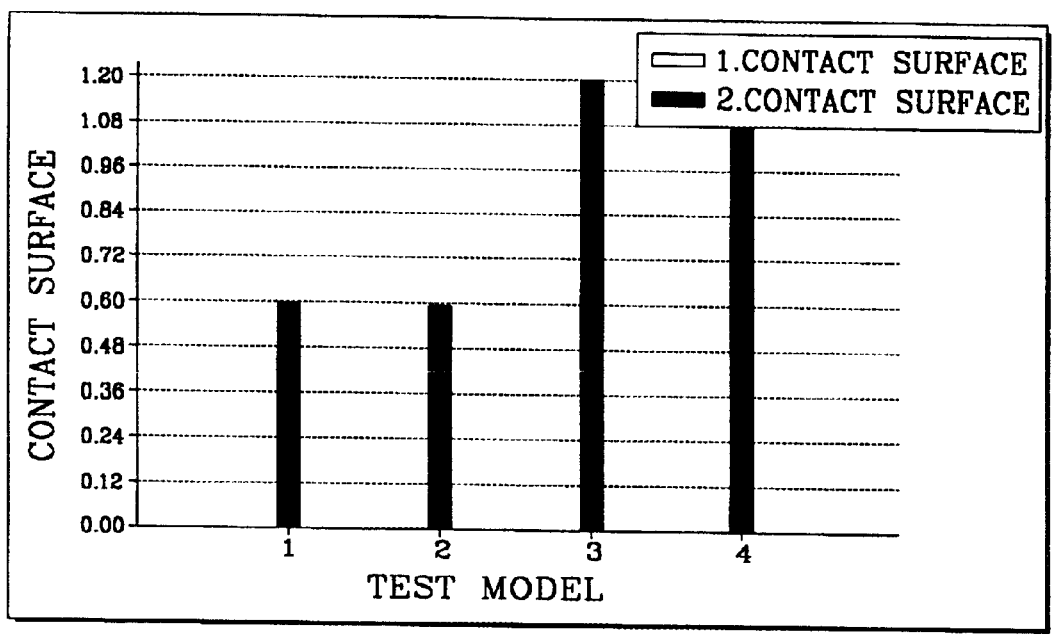

That is, for the contour region setting, the degree of the deformation and concentrated portions (colored in black in the drawing) of the door seal S situated between the side seal panel P and the door D, as shown in FIG. 10, have to be interpreted, while for the animation region setting, the degree of the deformation of the door seal S situated between the side seal panel P and the door D, as shown in FIG. 11, has to be interpreted step by step. Additionally, for the contact force/contact length region setting, the contact force and contact area per contact surface have to be interpreted with regard to each model.

Figure 13:
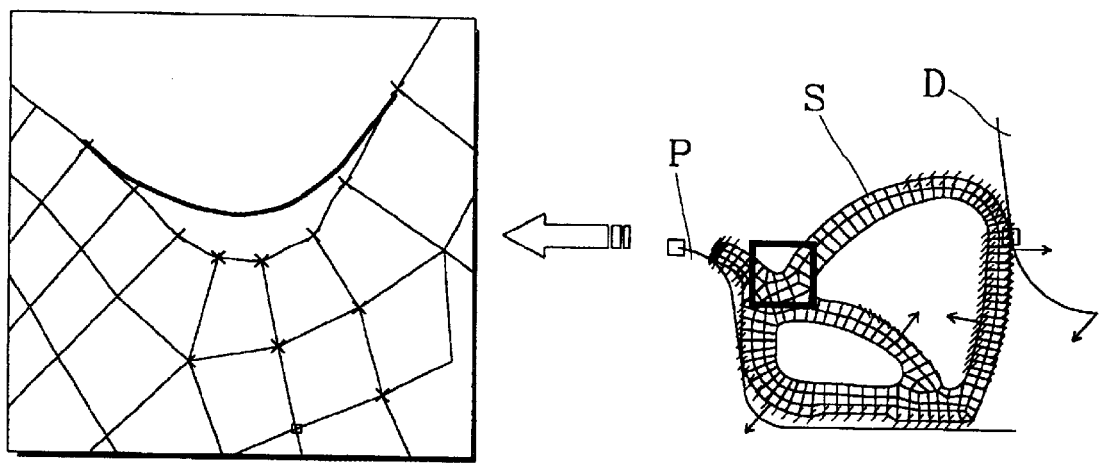
FIG. 13 is a view showing the interpretation of a door seal having modified portions deformed by the closing action of a door in a thickness variable interpretation step.
Figure 14:
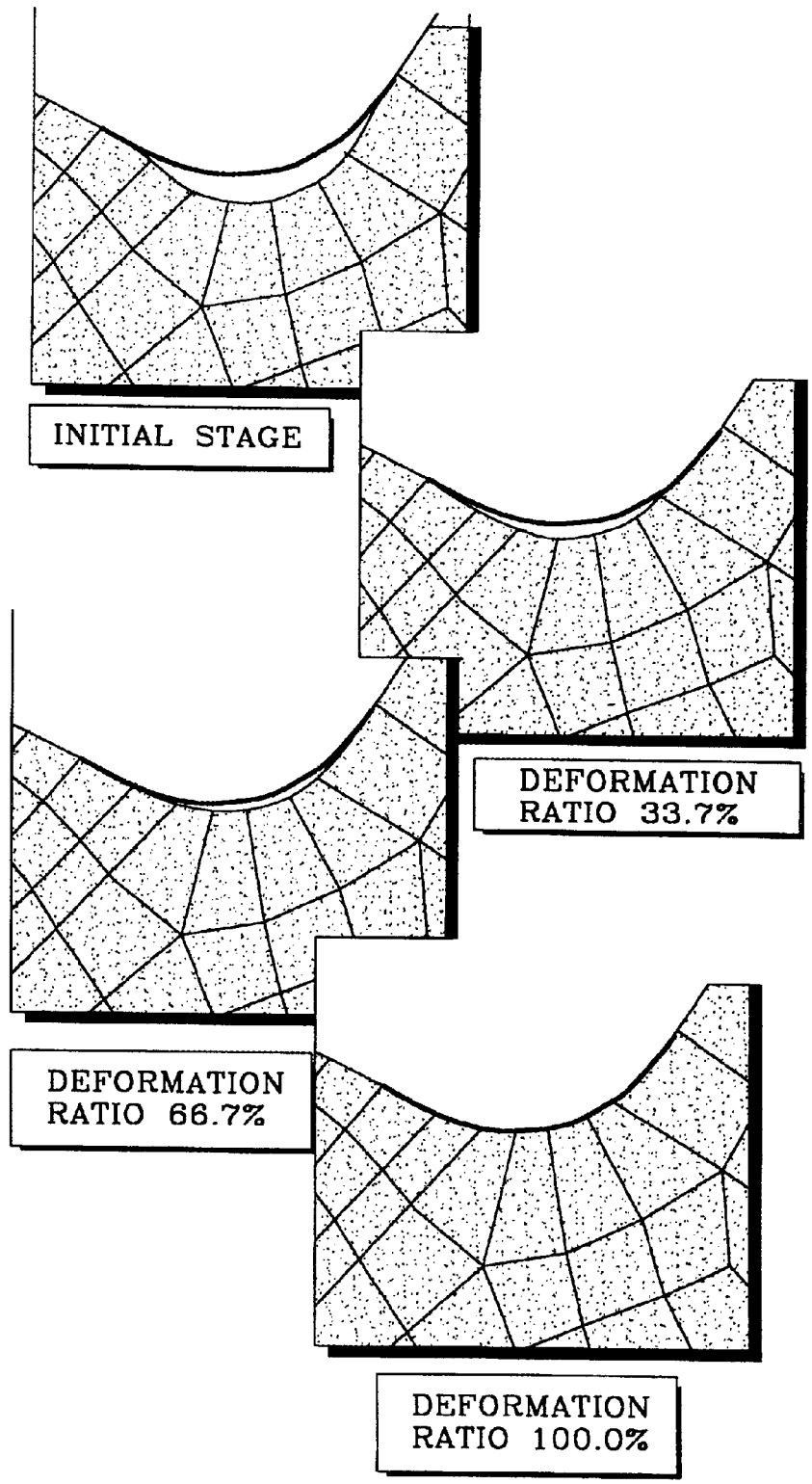
FIG. 14 is a view showing variations in thickness in relation to FIG. 13.
Figure 15A:
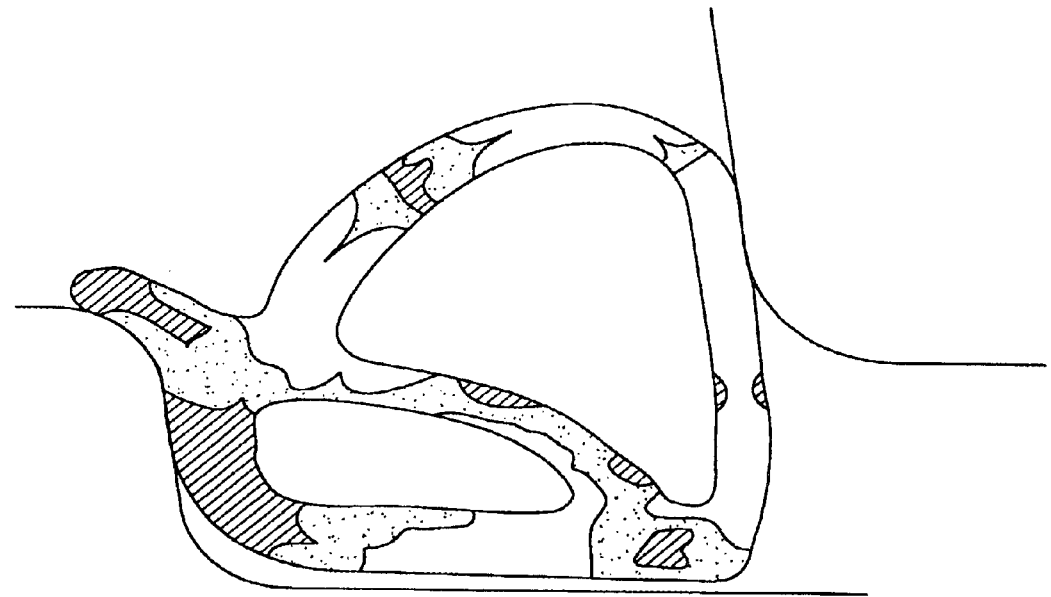
FIG. 15 is a view showing a deformation-stress state concerning a thickness variable interpretation step.
Figure 15B:
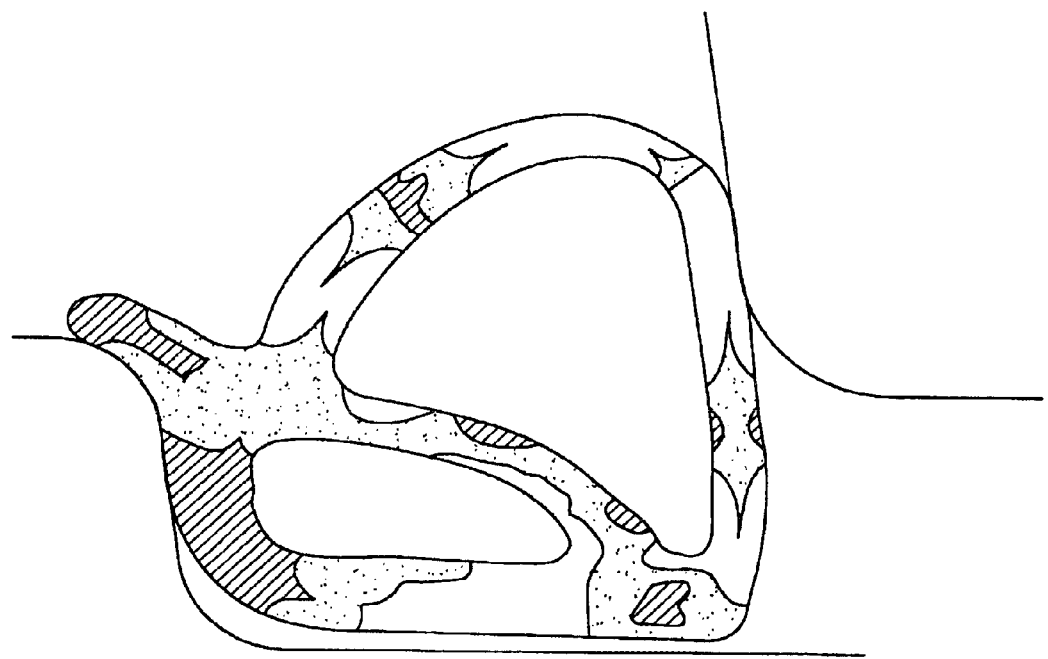
Figure 16:
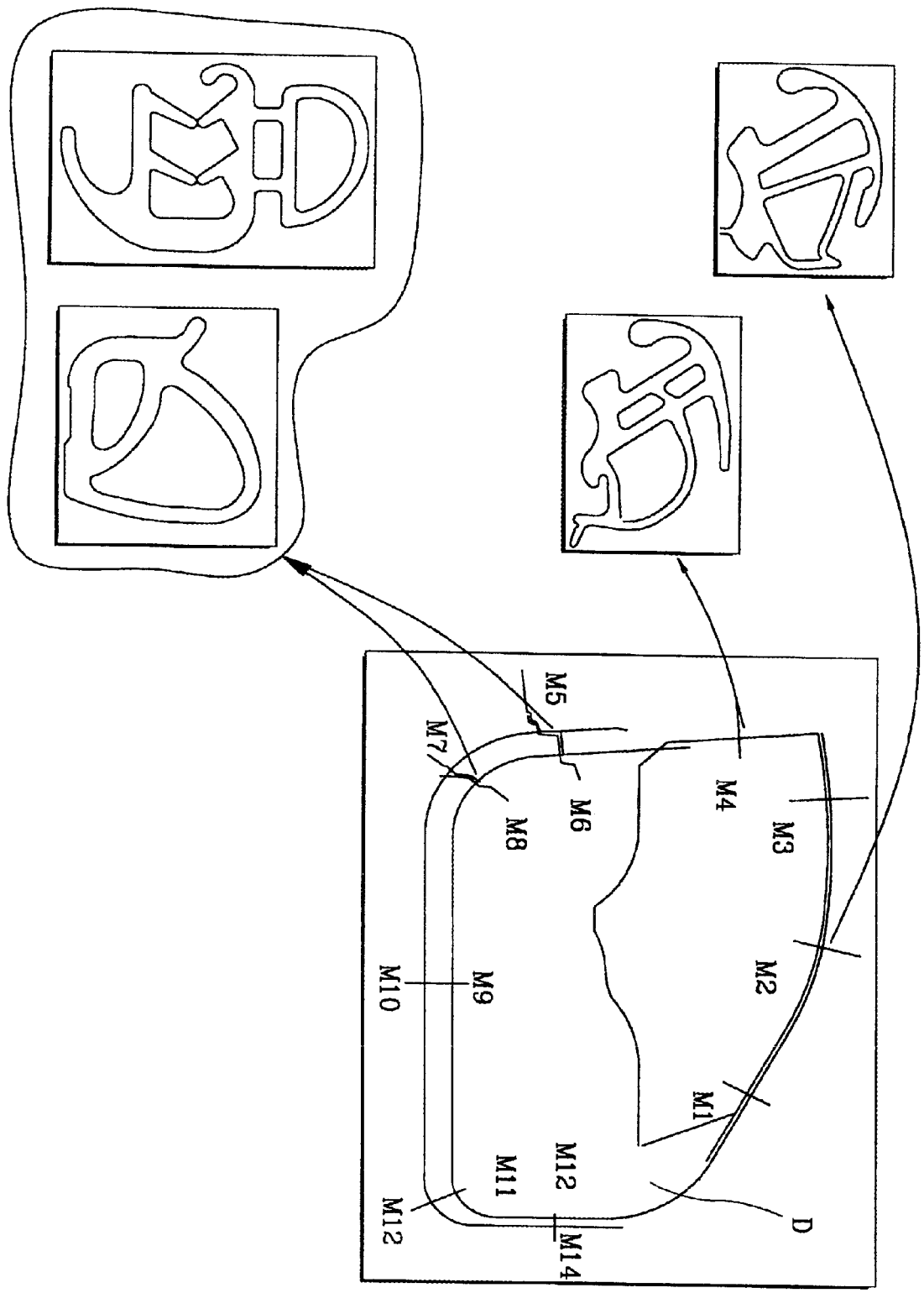
FIG. 16 is a view showing a state in which a door seal is mounted for the calculation of the static closing force of a door seal.

Additionally, in the thickness interpretation step, for the door seal S being situated between the side seal panel P and the door D and having modified portions a, b and c deformed by the closing action of the door B as shown in FIG. 13, the thickness of the weak portions and portions to be desired to deform is increased and reduced as shown in FIG. 14, and variations in deformation and stress with regard to the portions of the door seal S due to the variation in the thickness of the door seal S are known as shown in FIG. 15.

Figure 6:
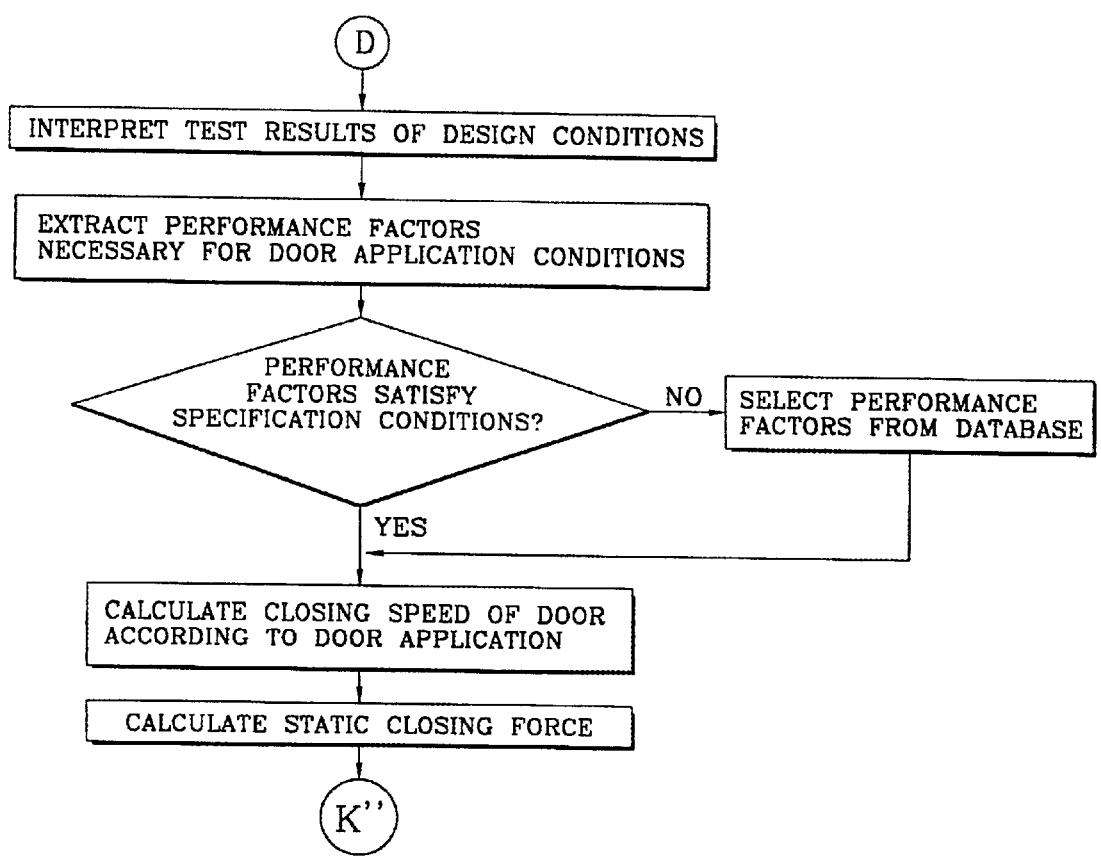

Thereafter, if the door application conditions are not set for the test model settled in the test model settlement step, there is performed a performance factor settlement step and a static closing force calculation step. In the performance factor settlement step, performance factors necessary for the door application conditions are extracted on the basis of test interpretation results performed in the design condition test step or performance factors are selected from the data storage means 1, as shown in FIG. 6. In the static closing force calculation step, the closing speed of the door D is calculated using the performance factors.

The performance factor settlement step is performed in such a way that differently shaped seals S (M1 to M14) are provided for the different shapes of the door D and the performance factors are settled from static reaction factors such as the air-tightness of an automobile, the volume of an automobile room and static reaction energy and from dynamic reaction factors such as the air entrapment of the door D, the air exhaustion from the door D, rotational resistance due to an extractor area, the inclination of a hinge, the weight of the door D, the self-weight moment of the central position, the door seal S, a storm rubber and a latch.

The interpretation of the static closing force calculation step performed after condition setting concerning performance factors is completed is performed by the following differential equation. The static closing force calculation step is interpreted by a quadratic differential equation using a R-K method.

$$J(d^2\theta/dt^2)+Mi(\theta)=0$$

where $Mi(\theta)=Mseal$ (seal reaction moment)+Mair (air reaction moment). In the above equation, Mseal is fseal($\theta$, s)lseal(s)ds and Mair is P($\theta$)h(x)xds, in which $\theta$ is a displacement angle, f is the reaction force of the seal, l is the length of the seal, P is an increase in pressure due to the closing of the door, h is the height of the door, and x is a length with regard to x axis.

Figure 17:
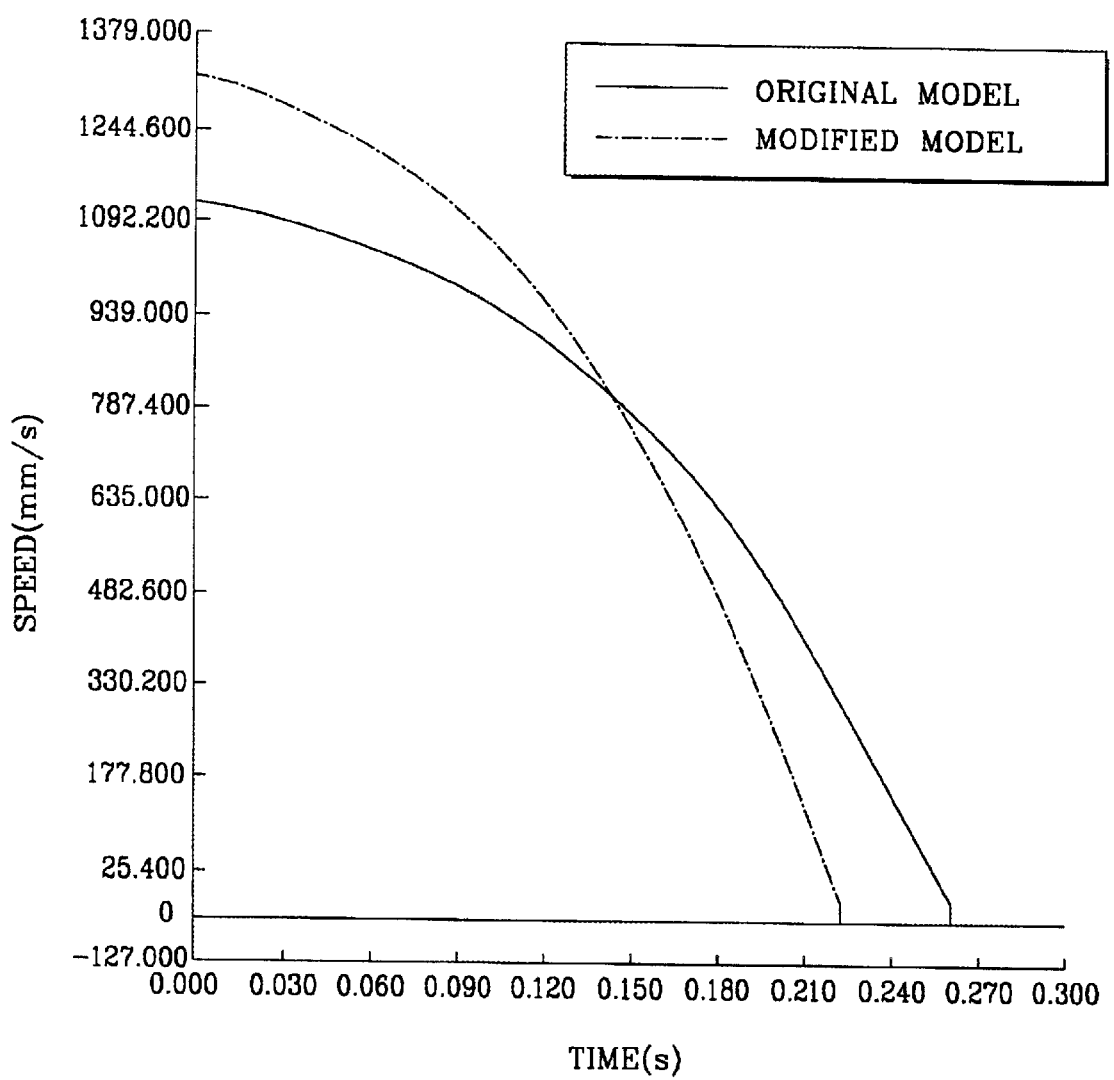
FIG. 17 is a closing speed-time diagram for an original model and a modified model.

When the static closing force of the door D is interpreted, time-speed relation is interpreted for an original test model as shown by a solid line in FIG. 17.

Figure 7:
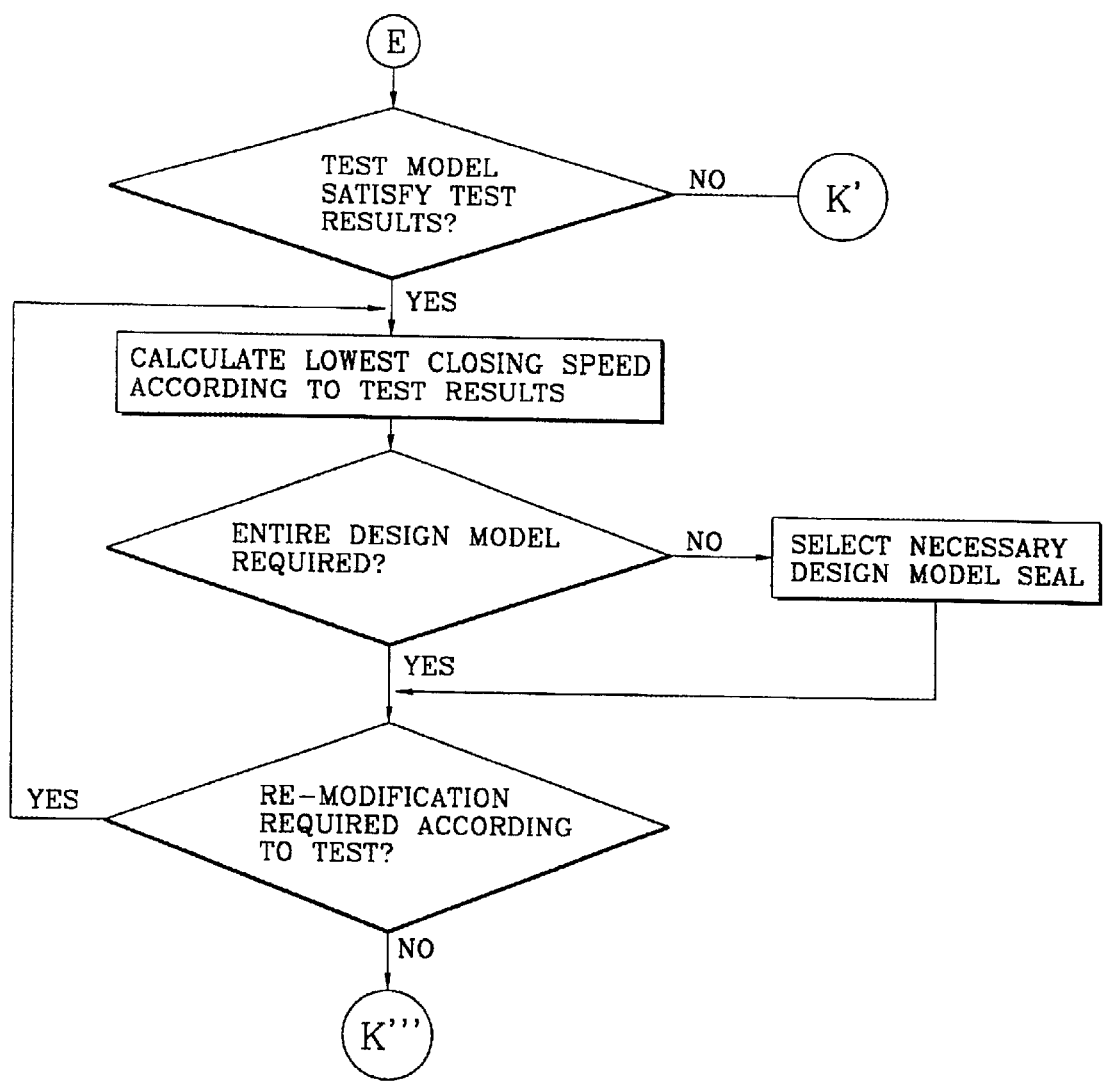
Figure 8A:
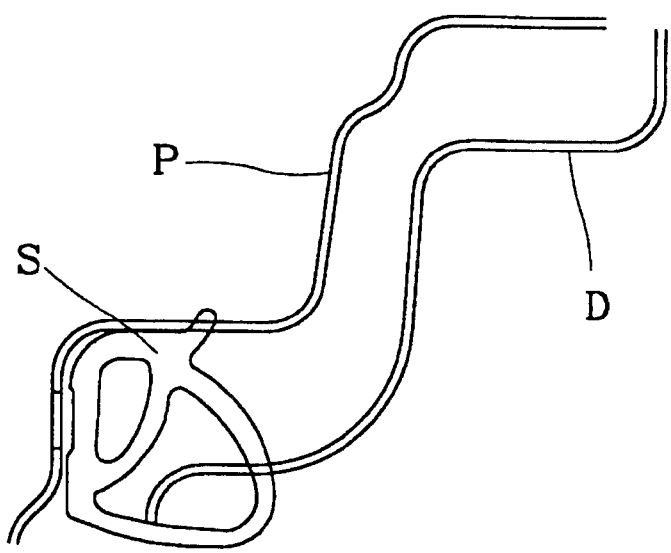
FIGS. 8A to 8D are views showing the order of test model selection.
Figure 8B:
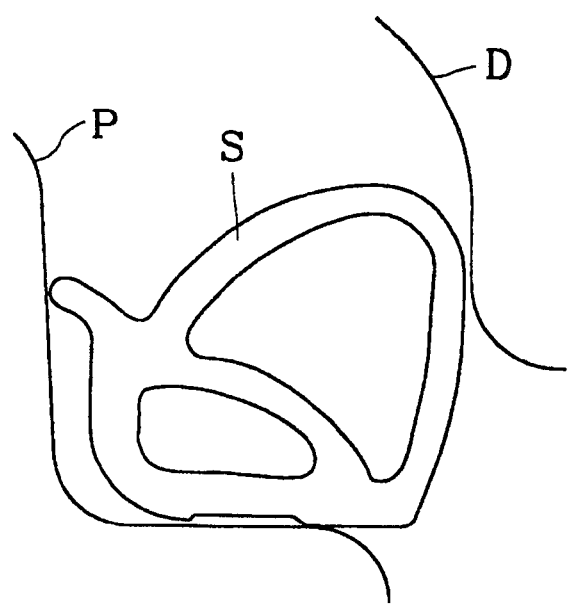
Figure 8C:
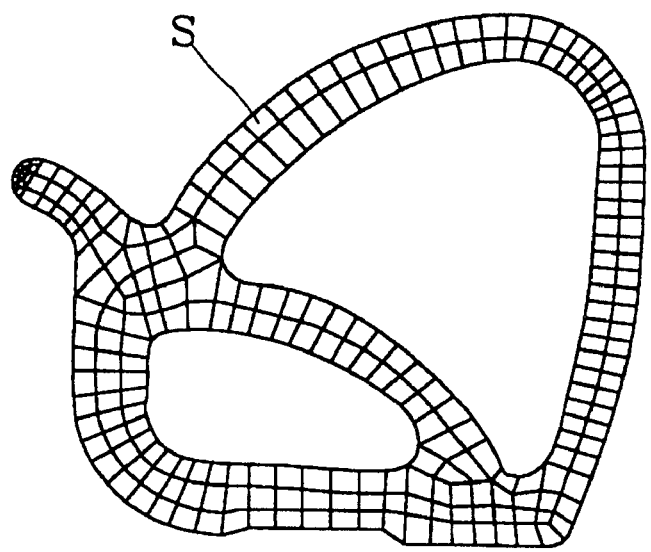
Figure 8D:
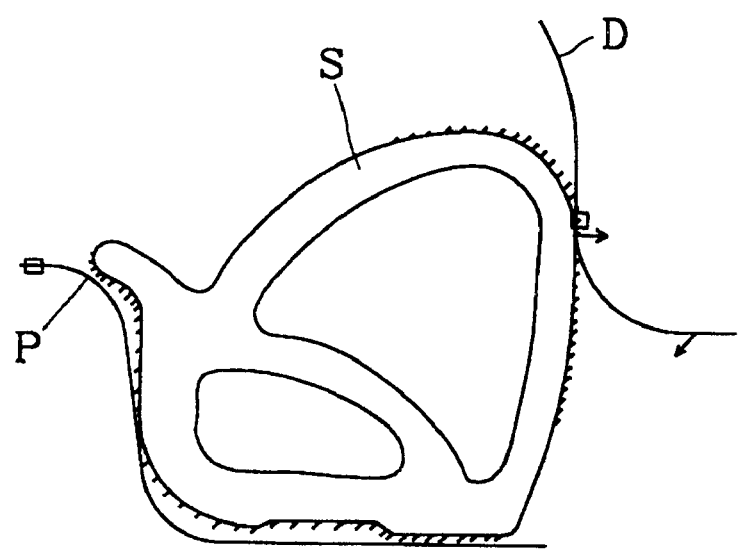

If modification for the interpretation results settled through the test model settlement step is required, there is performed the modification step in which while the lowest closing speed of the door D is calculated on the basis on the test interpretation results, all the selected door seals S or the selected door seal S are modified until the door seals or the door seal satisfy set conditions, as shown in FIG. 7. As a result, the interpretation results can be obtained for a modified model, as shown by a dotted line in FIG. 17.

As described above, the present invention provides a system and method for optimally designing automobile door seals, which is capable of allowing a designer without a professional knowledge of computer software to design a door seal having an optimal cross-section by varying design variables and elements necessary for various design steps, and of estimating the closing speed of an automobile door depending upon the variation of the cross-section of the door seal to prevent errors in the fabrication of a sample.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A system for optimally designing automobile door seals, comprising:

data storage means consisting of a plurality of storage units, each of said storage units having data necessary for each condition;

data management means consisting of a plurality of mode selection units for selecting a mode from the data storage means according to the characteristics of a door seal to be developed; and model design means for designing a complete door seal by imposing a variety of conditions on a model selected from the data management means and performing various tests, wherein said model design means comprises pre-processing means for testing the test model selected from the data management means using basic and fundamental application conditions, and wherein said pre-processing means comprises an initial condition setting unit and a test model setting unit, said initial condition setting unit consisting of a plurality of condition units for imposing various conditions concerning the mode and application of a model on the model to be designed, and said test model setting unit selecting a test model on which initial conditions are imposed by said initial condition setting unit, and if all conditions are not set for the test model, setting conditions for performing the interpretation of various deformations of the test model and interpreting changes according to the thickness variable of the door seal on the basis of the interpretation results, wherein the thickness of weak portions of the door seal and portions desired to be deformed is increased and decreased, and variations in deformation and stress with regard to the portions of the door seal due to the variation in the thickness of the door seal are known.

2. The system according to claim 1, wherein said model design means comprises post-processing means for settling a completed door seal by changing and revising the structure and shape of the test model and storing the data of the completed door seal in the data storage means.

3. The system according to claim 2, wherein said post-processing unit comprises a design condition setting unit, a variable mode setting unit, a door application preliminary condition setting unit and a modification setting unit, said design condition setting unit consisting of a plurality of design condition units for imposing a variety of design conditions on the test model selected from said test model setting unit, said variable mode setting unit consisting of a plurality of design variable mode units for imposing a variety of variables on the design condition setting unit, said door application preliminary condition setting unit consisting of a plurality of door application preliminary condition units for imposing correlation with an actual door on the variable mode setting unit, said modification setting unit consisting of a plurality of modification units for changing and modifying the test model on the basis of the results of interpretation performed in the door application preliminary condition setting unit.

4. A method for optimally designing automobile door seals, comprising:

a design condition setting step in which all conditions concerning a design project are set in such a way that the design project corresponding to an automobile being developed is selected in a data management means and the conditions set in mode selection units are retrieved from the storage units of a data storage means;

a test model setting step in which there are set test conditions concerning initial conditions according to the model designed by the post-processing means of a model design means;

a design condition test step, in which design conditions are imposed on the test model selected in a pre-processing means by a design condition setting unit and a variable mode setting unit in the post-processing means of a model design means, and the test model is interpreted;

a test model settlement step in which the test model, which is interpreted with regard to theoretical setting conditions by the door application preliminary condition (setting unit of the post-processing means, is interpreted on the basis of various conditions so as to find correlation with an automobile door; and a modification step in which the test model is modified if necessary on the basis of the interpretation results of the test model settled by the modification setting unit of the post-processing means, or the data of the completed door seal are stored in the storage units of the data storage means, wherein if all the test conditions required for the test model in the test model setting step are not set, there are performed a deformation characteristic setting step, a thickness variable interpretation step and a design condition interpretation step in order, said deformation characteristic setting step being preformed by setting conditions for performing the interpretation of various deformations of the test model, said thickness variable interpretation step being performed by interpreting changes according to the thickness variable of the door seal on the basis of interpretation results obtained in the deformation characteristic setting step, and wherein the thickness of weak portions of the door seal and portions desired to be deformed is increased and decreased, and variations in deformation and stress with regard to the portions of the door seal due to the variation in the thickness of the door seal are known.

5. The method according to claim 4, wherein if there are not set all the conditions required for the design project in said design condition setting step, there is performed an independent design step in which an independent test model is selected or a modification design step in which a modified test model is selected using previously designed data.

6. The method according to claim 4, wherein said deformation characteristic setting step is performed by imposing characteristics on a contour region setting, a deformed shape animation region setting and a contact force/contact length region setting so as to interpret the degree of deformation and the concentration portions of deformation attributable to the deformation of the door seal situated between the side seal panel and the door caused by the closing action of the door.

7. The method according to claim 4, wherein said modification step is performed in such a way that while the lowest closing speed of the door is calculated on the basis on the test interpretation results, all the door seals or the door seal are modified until the door seals or the door seal satisfy set conditions.

8. The method according to claim 5, wherein said interpretation of the characteristics of the material suitable for the structure and shape of the selected door seal is performed through a material selection step and a material contact condition setting step, said material selection step being preformed by selecting a material and interpreting the material, said material contact condition setting step being performed by imposing on the door seal boundary conditions concerning the contact portions of the door seal with the side seal panel and the door.

9. The method according to claim 5, wherein said modification design step is performed in such a way that a single seal or a plurality of seals are selected using previous data retrieved from the storage units of the data storage means and the independent test model selected in the independent design step is tested.

10. The method according to claim 8, wherein said material contact condition setting step is performed by rigid body to deformable body interpretation and deformable body to deformable body interpretation, said rigid body to deformable body interpretation being preformed by interpreting the deformation of the friction-deformed portion of the door seal in contact with the side seal panel, the deformable body to deformable body interpretation being performed by interpreting the deformation of the self-weight-deformed portion of the door seal due to the structure the door seal.

11. A method for optimally designing automobile door seals, comprising:

a design condition setting step in which all conditions concerning a design project are set in such a way that the design project corresponding to an automobile being developed is selected in a data management means and the conditions set in mode selection units are retrieved from the storage units of a data storage means;

a test model setting step in which there are set test conditions concerning initial conditions according to the model designed by the post-processing means of a model design means;

a design condition test step, in which design conditions are imposed on the test model selected in a pre-processing means by a design condition setting unit and a variable mode setting unit in the post-processing means of a model design means, and the test model is interpreted;

a test model settlement step in which the test model, which is interpreted with regard to theoretical setting conditions by the door application preliminary condition setting unit of the post-processing means, is interpreted on the basis of various conditions so as to find correlation with an automobile door; and a modification step in which the test model is modified if necessary on the basis of the interpretation results of the test model settled by the modification setting unit of the post-processing means, or the data of the completed door seal are stored in the storage units of the data storage means, wherein if the door application conditions are not set for the test model settled in the test model settlement step, there is performed a performance factor settlement step and a static closing force calculation step, said performance factor settlement step being performed in such a way that performance factors necessary for the door application conditions are extracted on the basis of test result interpretation performed in the design condition test step or performance factors are selected from the data storage means, said static closing force calculation step is performed in such a way that the closing speed of the door is calculated using the performance factors, and wherein said performance factor settlement step is performed in such a way that differently shaped seals are provided for the different shapes of the door and the performance factors are settled from static reaction factors such as the air-tightness of an automobile, the volume of an automobile room and static reaction energy and from dynamic reaction factors such as the air entrapment of the door, the air exhaustion from the door, rotational resistance due to an extractor area, the inclination of a hinge, the weight of the door, the self-weight moment of the central position, the door seal, a storm rubber and a latch.

* * * * *